United States Patent
Gao (10) Patent No.: US 12,336,152 B2
(45) Date of Patent: Jun. 17, 2025

(54) HYBRID SYSTEM FOR SERVERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 84 days.

(21) Appl. No.: 17/644,500

(22) Filed: Dec. 15, 2021

(65) Prior Publication Data

US 2023/0189484 A1 Jun. 15, 2023

(51) Int. Cl.
*H05K 7/20* (2006.01)

(52) U.S. Cl.
CPC ......... *H05K 7/208* (2013.01); *H05K 7/20309* (2013.01); *H05K 7/20318* (2013.01); *H05K 7/20327* (2013.01); *H05K 7/20381* (2013.01); *H05K 7/20409* (2013.01); *H05K 7/20509* (2013.01)

(58) Field of Classification Search
CPC ........... H05K 7/20309; H05K 7/20318; H05K 7/20327; H05K 7/20381; H05K 7/20409; H05K 7/20509
See application file for complete search history.

(56) References Cited

U.S. PATENT DOCUMENTS

| | | | | |
|---|---|---|---|---|
| 6,366,462 B1 * | 4/2002 | Chu | ...................... | H01L 23/427 257/714 |
| 6,994,151 B2 * | 2/2006 | Zhou | ..................... | H01L 23/427 174/15.1 |
| 7,336,487 B1 * | 2/2008 | Chrysler | ............... | H01L 23/473 361/679.48 |
| 7,568,519 B2 * | 8/2009 | Nakahama | .......... | H01L 23/4735 165/80.4 |
| 10,264,706 B2 * | 4/2019 | Wan | ................... | H05K 7/20318 |
| 11,602,087 B2 * | 3/2023 | Zhou | .................. | H05K 7/20336 |
| 2020/0029466 A1 * | 1/2020 | Long | .................. | H05K 7/20309 |
| 2021/0043376 A1 * | 2/2021 | Kienle | ..................... | H01G 2/08 |
| 2022/0065547 A1 * | 3/2022 | Haruki | ............... | F28D 15/0266 |
| 2022/0084905 A1 * | 3/2022 | Koyama | .................. | H05K 7/20 |

FOREIGN PATENT DOCUMENTS

CN 113597202 A * 11/2021

OTHER PUBLICATIONS

CN-113597202-A Translation.*

* cited by examiner

*Primary Examiner* — Jacob R Crum
*Assistant Examiner* — Matthew Sinclair Muir
(74) *Attorney, Agent, or Firm* — WOMBLE BOND DICKINSON (US) LLP (57) ABSTRACT

Systems, apparatuses and methods to provide a hybrid cooling for servers of a data center are described. A cooling plate comprises an inlet port to receive a coolant from a coolant source. The coolant is a two-phase coolant that transforms from a liquid state into vapor when being attached to an electronic device to extract heat from the electronic device. The cooling plate comprises an outlet port to output at least a portion of the coolant back to the coolant source. The cooling plate comprises a vapor port to output the vapor generated from the coolant to a condenser that is configured to condense the vapor back to the liquid state.

8 Claims, 6 Drawing Sheets

Cold plate design

HYBRID SYSTEM FOR SERVERS

FIELD

Embodiments of the present disclosure relate generally to data center cooling. More particularly, embodiments of the disclosure relate to a hybrid system for servers.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. A proper thermal environment needs to be maintained for operations of the servers in data centers, the server performance and lifetime. The existing cooling techniques are not effective and efficient enough to cool high performance servers.

The existing cooling techniques for a single phase immersion cooling do not solve the hot spot challenges efficiently. The existing cooling techniques for a two-phase immersion system only use rack level fluid recirculation without any local cooling.

BRIEF DESCRIPTION OF THE DRAWINGS

The appended drawings illustrate examples and are, therefore, exemplary embodiments and not considered to be limiting in scope.

DETAILED DESCRIPTION

Systems and methods to provide a hybrid system for servers are described. Devices, server and rack co-designs, systems and methods for designing and deploying immersion and phase change cooling systems for high power density servers and electronics are also described.

In at least some embodiments, a cooling plate comprises an inlet port to receive a coolant from a coolant source. The coolant is a two-phase coolant that transforms from a liquid state into vapor when being attached to an electronic device to extract heat from the electronic device. The cooling plate comprises an outlet port to output at least a portion of the coolant back to the coolant source. The cooling plate comprises a vapor port to output the vapor generated from the coolant to a condenser that is configured to condense the vapor back to the liquid state.

In at least some embodiments, a hybrid cooling system comprises one or more cooling plates. At least one of the one or more cooling plates comprises a plurality of cooling channels. An inlet port is coupled to the plurality of cooling channels. An outlet port is coupled to the plurality of cooling channels. A vapor port is coupled to the plurality of cooling channels. The hybrid cooling system comprises one or more server units having one or more electronic devices attached to the one or more cooling plates. At least one of the one or more server units comprises an inlet port that is coupled to the inlet port of the at least one of the cooling plates to receive a coolant from a coolant source. The coolant is a two-phase coolant that transforms from a liquid state into vapor when being attached to the one or more electronic device to extract heat from the one or more electronic devices. At least one of the one or more server units comprises an outlet port that is coupled to the outlet port of the at least one of the one or more cooling plates to output at least a portion of the coolant back to the coolant source. At least one of the one or more server units comprises a vapor port that is coupled to the vapor port of the at least one of the one or more cooling plates. A vapor channel is coupled to the vapor port of the at least one of the one or more server units to output the vapor generated from the coolant to a condenser that is configured to condense the vapor back to the liquid state.

In at least some embodiments, a method to cool a data center electronic rack that comprises one or more server units and one or more cooling plates coupled to the one or more server units is described. A first pump coupled to the one or more cooling plates to supply a coolant from a coolant source is operated at a first speed. A second pump coupled to the one or more cooling plates to return at least a portion of the coolant back to the coolant source is operated at a second speed. An electronic rack power condition is monitored. The speeds of the first pump and the second pump are controlled and adjusted based on the monitoring.

Embodiments of a cooling device, a server and an overall system codesign are used to build a hybrid cooling system using single phase immersion and phase change technologies. The described techniques may efficiently be used for designing and deploying high power density servers.

In at least some embodiments, an advanced cooling (cold) plate includes three ports. The three ports of the advanced cooling plate include a two phase liquid inlet port, a two phase liquid outlet port, and a vapor port. The inlet port and the outlet port are connected to dedicated fluid channels within the cold plate. The vapor port is packaged on a side of the cold plate that is a top side once a server including electronics components is populated the system. The fluid channel includes a vapor exit channel connecting with a vapor release port. The cooling plate uses a two phase coolant and the coolant changes from a liquid phase to a vapor phase by heat generated from the electronics components. The vapor and liquid are mostly separated within the cold plate. Three distribution units are integrated in the system. The liquid loops are assembled with at least two pumps. The at least two pumps are operated at different speed based on the power density, as described in further details below.

In at least some embodiments, the described techniques provide cooling plates for two phase immersion cooling. The described techniques provide efficient cooling that eliminate hot spots in a single phase immersion system. The described techniques are used to accommodate different server hardware and configurations. The described techniques support increase in power densities. The described techniques are flexible for different electronics. The described techniques provide efficient vapor and liquid separations. The described techniques simplify deployment, operation; and increase efficiency of the cooling systems for IT data centers.

Various embodiments and aspects of the disclosure will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Figure 1:
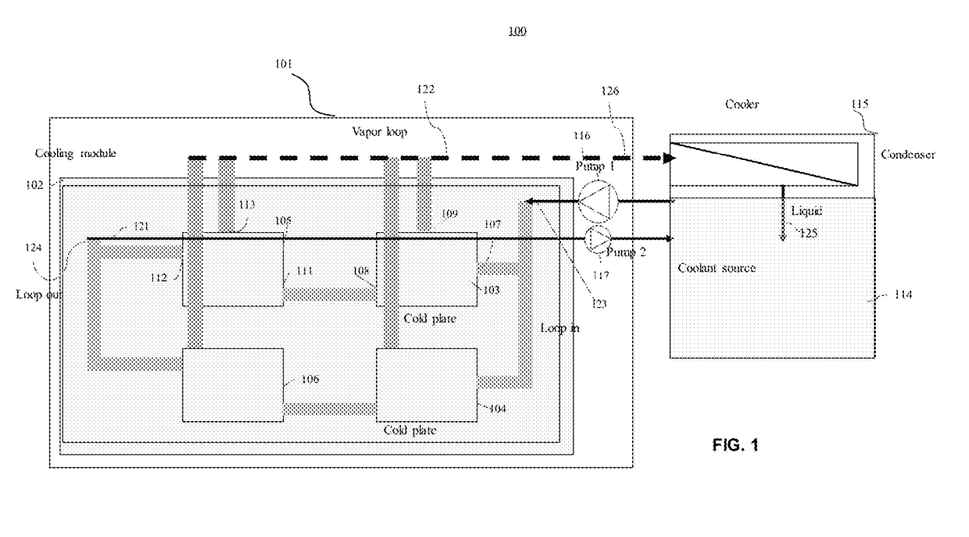
FIG. 1 is a view illustrating a cooling system for a server chassis according to one embodiment.

FIG. 1 is a view 100 illustrating a cooling system for a server chassis according to one embodiment. A cooling system 101 includes a cooling module (apparatus) 102. The cooling apparatus 102 includes cold (cooling) plates, such as a cooling plate 103, a cooling plate 104, a cooling plate 105 and a cooling plate 106 to remove at least a portion of the heat generated by IT components positioned thereon.

In at least some embodiments, the cooling plate has at least three ports. As shown in FIG. 1, the cooling plate 103 includes an inlet port 107 to input a coolant from a coolant source 114. The cooling plate 103 includes an outlet port 108 to output a liquid portion of the coolant. The cooling plate 103 includes a vapor port 109 to output a vapor generated from the coolant when a temperature of the coolant is greater than a predetermined threshold back to a cooler/condenser 115 that is coupled to the coolant source 114. The cooling plate 105 includes an inlet port 111 to input a coolant from the outlet port 108. The cooling plate 105 includes an outlet port 112 to output a liquid portion of the coolant back to the coolant source. The cooling plate 105 includes a vapor port 113 to output a vapor generated from the coolant by a heat back to a cooler/condenser 115 that is coupled to the coolant source 114.

As shown in FIG. 1, the cooling system 101 includes a liquid return loop 121 that includes a loop input 123 to input a liquid coolant from the coolant source 114 and a loop output 124 to output the liquid coolant back to the coolant source 114. The cooling system 101 includes a vapor return loop 122. The liquid return loop 121 includes inlet port 107 and outlet port 108 of the cooling plate 103 and inlet port 111 and outlet port 112 of the cooling plate 105 that are connected in series. The liquid return loop 121 includes the inlet and outlet ports of the cooling plates 104 and 106 that are connected in series. As shown in FIG. 1, the cooling plates 103 and 105 are connected in parallel with the cooling plates 104 and 106. In at least some embodiments, liquid (fluid) ports of the cooling plate are fluid quick disconnectors. In at least some embodiments, the fluid loop is in a server chassis. In at least some embodiments, the fluid loop 121 is in an immersion tank. In at least some embodiments, a server has multiple cold plate loops that are coupled to a vapor loop that is connected to a tank vapor loop, as described in further detail below with respect to FIG. 4.

The vapor return loop 122 includes a loop input 123 to input a two-phase liquid coolant from the coolant source 114 and a loop output 126 to output a vapor generated from the two-phase liquid coolant when the temperature of the liquid coolant is greater than a predetermined temperature threshold back to a cooler/condenser 115. The vapor return loop 122 includes corresponding vapor ports of the cooling plates 103, 104, 105, and 106 that are connected in parallel. The cooling system 101 includes a pump 116 coupled to the inlet port 107 to pump the coolant from the coolant source 114. The cooling system 101 includes a pump 117 coupled to the outlet port 112 to pump a heated liquid portion of the coolant back to the coolant source 114. In at least some embodiments, the coolant from the coolant source 114 is a two phase liquid coolant. As shown in FIG. 1, the cooling system 101 uses a two phase coolant pumping and recirculating across the system. A liquid two phase coolant is pumped into the cold plate using the pump 116, a partial of the liquid of the two phase coolant exits the cold plate and a partial of the two phase liquid coolant that has changed to a vapor is released to the condenser 115.

In at least some embodiments, the cooling system 101 includes a hybrid cooling environment that uses a combination of single phase immersion cooling and a pumped two-phase cooling. As shown in FIG. 1, the pump 1 116 is used for pumping the liquid into the server and the pump 2 117 is used on the returning portion of the loop 121 for pumping partial of the fluid back to the coolant source 114. The vapor is condensed back at the condenser 115 to a liquid 125 that is directly returned back to the coolant source 114. As it is shown in FIG. 1, the IT components on the cold plates are populated in a vertical manner and the entire cooling module 102 is populated in a vertical manner. The vapor ports of the cooling plates, such as vapor port 109 and vapor port 113 are assembled on the top side of the cooling plate to increase efficiency of managing the vapor to the condenser 115.

Figure 2A:
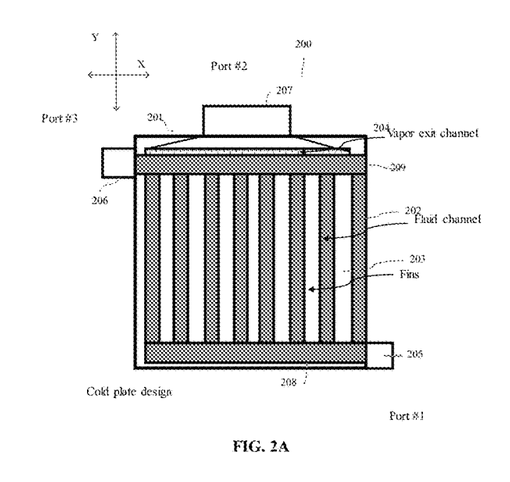
FIG. 2A is a view showing a cooling plate according to one embodiment.

FIG. 2A is a view 200 showing a cooling plate 201 according to one embodiment. As shown in FIG. 2A, a cooling channel 208 is at a bottom of the cooling plate 201 and a cooling channel 209 is at a top of the cooling plate 201. The cooling channel 208 and the cooling channel 209 extend on the cooling plate 201 in a horizontal direction X, as shown in FIG. 2A. A plurality of internal cooling channels 202 extend on the cooling plate 201 between the bottom cooling channel 208 and top cooling channel 209 in a vertical direction Y, as shown in FIG. 2A. An inlet port 205 is coupled to a bottom of the cooling channel 208 to input a liquid coolant from a coolant source, such as the coolant source 114 or other coolant source to pass through the cooling channel 208, cooling channels 202 and cooling channel 209. As shown in FIG. 2A, cooling channel 209 is a top channel that is connected with a vapor exit channel 204. An outlet port 206 (Port #3) is coupled to an end of the cooling channel 209 to output a liquid portion of the coolant, after the coolant from the inlet port 205 (Port #1) passes through the cooling channel 208, cooling channels 202 and cooling channel 209, back to the coolant source. In at least some embodiments, the coolant that passes through the channels of the cooling plate 201 is a two phase liquid coolant. In at least some embodiments, the inlet port 205 is a two phase liquid inlet port. In at least some embodiments, the outlet port 206 is a two phase liquid outlet port. The inlet port 205 is connected to internal cooling channels 202 through cooling channel 208. The outlet port 206 is connected to internal cooling channels 202 through cooling channel 209. In at least some embodiments, the liquid coolant is pumped from the inlet port 205 to outlet port 206 by a pump.

In an embodiment, the outlet port 207 is fluidly connected to the one or more cooling channels within the cooling plate which are closer to the outlet port, as well as to the channels located at the top within the cooling plate.

The cooling plate 201 has a vapor output port 207 (Port #2) coupled to the cooling channels to output a vapor generated from the coolant by a heat back to a cooler/condenser that is coupled to the coolant source. As shown in FIG. 2A, the cooling plate 201 includes the vapor exit channel 204 connected to the vapor output port 207. In an embodiment, the vapor exit channel is machined in an optimized shape for segregating the vapor from the two phase liquid. As shown in FIG. 2A, the vapor exit channel 204 is positioned on and extends along the cooling channel 209. The vapor exit channel 204 is used to release the vapor that is generated from the liquid that exits the cold plate 201 through channel 209 and outlet port 206. The vapor output port 207 is at a top side of the cooling plate 201. The vapor output port 207 extends vertically on the top of the vapor exit channel 204 to increase the speed of the vapor exiting the cold plate. The cooling channels 202 are separated by fins 203. In one embodiment, the cooling channels 202 are interleaved with fins 203. The outlet port 206 and the inlet port 205 are at opposing sides of the cooling plate 201. In at least some embodiments, the outlet port and the inlet port are at different heights along a side of the cooling plate. The outlet port 206 is positioned at the height that is greater than the height of the inlet port 205 relative to the bottom of the plate 201.

Figure 2B:
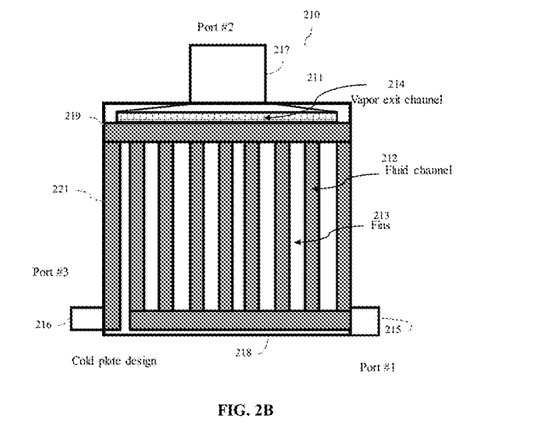
FIG. 2B is a view showing a cooling plate according to another embodiment.

FIG. 2B is a view 210 showing a cooling plate 211 according to another embodiment. The cooling plate 211 is different from the cooling plate shown in FIG. 2A in that the inlet and outlet ports of the cooling plate 211 are designed at the same height along a side of the cooling plate. As shown in FIG. 2B, the cooling plate 211 includes a cooling channel 218 at a bottom of the cooling plate 211 and a cooling channel 219 at a top of the cooling plate 211, internal cooling channels 212 extending on the cooling plate 211 between the bottom cooling channel 218 and top cooling channel 219, as described above. As shown in FIG. 2B, the cooling plate 211 includes an inlet port 215 (Port #1) that is coupled to an end of the cooling channel 218 to input a liquid coolant from a coolant source, as described above. As shown in FIG. 2B the cooling plate 211 includes an outlet port 216 (Port #3) that is coupled to an end of an internal cooling channel 221 that extends from the cooling channel 219 along the cooling plate 211 in a vertical direction Y. The outlet port 216 is used to output a liquid portion of the coolant, after the coolant from the inlet port 215 passes through the cooling channel 218, internal cooling channels 212, cooling channel 219 and internal cooling channel 221 back to the coolant source.

In at least some embodiments, the coolant that passes through the channels of the cooling plate 211 is a two phase liquid coolant. In at least some embodiments, the inlet port 215 is a two phase liquid inlet port. In at least some embodiments, the outlet port 216 is a two phase liquid outlet port. The inlet port 215 is connected to internal cooling channels 212 through cooling channel 218. The outlet port 216 is connected to cooling channel 219 and internal cooling channels 212 through internal cooling channel 221. In at least some embodiments, the liquid coolant is pumped from the inlet port 215 to outlet port 216 by a pump, as described above.

The cooling plate 211 has a vapor output port 217 (Port #2) coupled to the cooling channels to output a vapor generated from the coolant by a heat back to a cooler/condenser that is coupled to the coolant source. As shown in FIG. 2B, the cooling plate 211 includes a vapor exit channel 214 connected to the vapor output port 217. As shown in FIG. 2B, the vapor exit channel 214 is positioned on and extends along the cooling channel 219. The vapor exit channel 214 is used to release the vapor that is generated from the liquid that exits the cold plate 211 through channel 219, channel 221 and outlet port 216. As shown in FIG. 2B, the vapor output port 217 is at a top side of the cooling plate 211. As shown in FIG. 2B, the vapor output port 217 extends vertically on the top of the vapor exit channel 214 to increase the speed of the vapor exiting the cold plate. As shown in FIG. 2B, the cooling channels 212 are separated by fins 213. In one embodiment, the cooling channels 212 are interleaved with fins 213. As shown in FIG. 2B, the outlet port 216 and the inlet port 215 are at opposing sides of the cooling plate 211. In at least some embodiments, the outlet port and the inlet port are at similar heights along a side of the cooling plate. As shown in FIG. 2B, the outlet port 216 is positioned at the height that is similar to the height of the inlet port 215 relative to the bottom of the plate 211. Different cooling plates may be used to accommodate different cooling scenarios. The cooling plates may be optimized for vapor separation from the liquid. The embodiments of the cold plate described herein increase the liquid flow of the two phase liquid coolant, efficiently separate the vapor flow from the liquid flow of the two phase coolant and provide a full thermal loop recirculation. As shown in FIGS. 2A and 2B, the liquid ports are designed at locations that are lower than the location of the vapor port. The vapor port is designed at the top of the cooling system.

Figure 3:
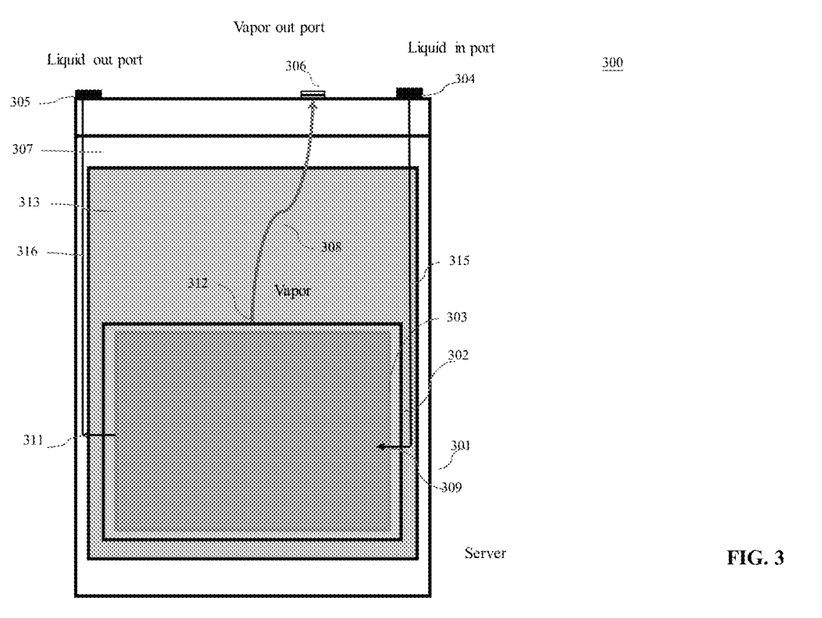
FIG. 3 shows a top view of a server with cooling system according to one embodiment.

FIG. 3 shows a view 300 of a server cooling system 301 according to one embodiment. In at least some embodiments, the cooling system 301 includes an electronic rack. In at least some embodiments, the cooling system 301 includes a server chassis including an immersion tank with immersion cooling liquid 307. In at least some embodiments, cooling system 301 represents one of the cooling systems described above. The cooling system 301 includes an electronic board on a server chassis 313 that is submerged into the immersion cooling liquid 307. As shown in FIG. 3, a cooling module 302 is attached to the server chassis 313. The cooling module 302 includes a cooling plate 303, a liquid inlet port 309 coupled to the cooling plate 303, a liquid outlet port 311 coupled to the cooling plate 303 and a vapor port 312 coupled to the cooling plate 303. In at least some embodiments, cooling plate 303 represents one of the cooling plates as shown in FIGS. 2A and 2B. In at least some embodiments, cooling plate 303 represents an overall cooling module with more than one cooling plates inside, where the cooling plates are arranged in either in series or parallel manners. In at least some embodiments, cooling module 302 represents one of the cooling modules as described above. The cooling system 301 includes a liquid inlet port 304 that connects to liquid inlet port 309 via one or more liquid lines 315 to pass the two-phase liquid coolant from a coolant source to the fluid channels of the cooling plate 303. The cooling system 301 includes a liquid outlet port 305 connected to the liquid outlet port 311 via one or more liquid lines 316 to pass the two-phase liquid coolant back to the coolant source. The cooling system 301 includes a vapor out port 306 connected to the vapor port 312 via one or more vapor lines 308 to pass a vapor generated from the two-phase liquid coolant when the temperature of the liquid coolant is greater than a predetermined temperature threshold back to a condenser coupled to the coolant source. As shown in FIG. 3, the cooling system 301 includes three ports—such as liquid inlet port 304, liquid outlet port 305 and vapor out port 306 and connections to the corresponding ports of the cooling module 302. The cooling system 301 enables the connections between the system loops and the three ports of the cold plates. The liquid inlet port 304 is used to connect with one or more liquid inlet ports of the cold plates. The vapor out port 306 is used to connect with one or more vapor out ports of the cold plates. The liquid outlet port 305 is used to connect with one or more liquid outlet ports of the cold plates. In at least some embodiments, the inlet port 304, the outlet port 305, and the vapor out port 306 are connected to the inlet port 309, the outlet port 311 and the vapor port 312 respectively via flexible connectors. In an embodiment, the ports 305, 306, and 304 are dripless quick disconnects.

Figure 4:
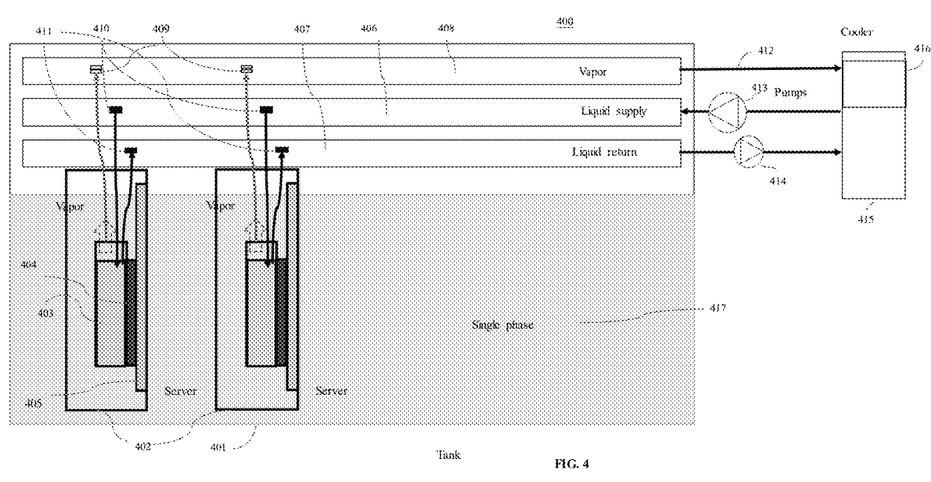
FIG. 4 is a view of a hybrid cooling system according to one embodiment.

FIG. 4 is a view of a hybrid cooling system 400 according to one embodiment. The hybrid cooling system 400 includes an immersion container 401 that contains a single phase coolant 417 to accommodate server units 402. As shown in FIG. 4, a server unit 402 includes a high power chip 404 (e.g., a server device, a processor, a memory, and/or other electronic device) on a cooling plate apparatus (module) 403 on a chassis 405. In at least some embodiments, cooling plate module 403 represents one of the cooling plate modules (apparatuses), as described above. In at least some embodiments, cooling plate module 403 includes a plurality of cooling channels, an inlet port coupled to the plurality of cooling channels to input a two phase coolant from a coolant source 415. The cooling plate module 403 includes an outlet port coupled to the plurality of cooling channels to output a heated liquid portion of the two phase coolant back to the coolant source 415. The cooling plate module 403 includes a vapor port coupled to the plurality of cooling channels, as described above. In at least some embodiments, the server unit 402 represents the cooling system 501 as described above with respect to FIG. 3. The server unit 402 includes an inlet port coupled to the inlet port of the cooling plate module 403. The server unit 402 includes an outlet port coupled to the outlet port of the of cooling plate module 403. The server unit 402 includes a vapor out port coupled to the vapor output port of the cooling plate module 403. The hybrid cooling system 400 includes a liquid supply channel 406, a liquid return channel 407 and a vapor channel 408. As shown in FIG. 4, vapor channel 408 is a part of the vapor loop. The liquid supply channel 406 includes liquid supply ports 410 that are connected to the inlet ports of the server units 402 to supply a two phase liquid coolant to the cooling plates 403 from the coolant source 415 by using a liquid supply pump 413. The liquid return channel 407 includes liquid return ports 411 that are connected to the outlet ports of the server units 402 to return a heated liquid coolant from the cooling plates 403 back to the coolant source 415 by using a liquid return pump 414. The vapor channel 408 includes vapor ports 409 that are connected to the vapor output ports of the server unit 402 to output a vapor generated from the two phase coolant by a heat to a condenser 416 via a vapor line 412. As shown in FIG. 4, condenser/cooler 416 is attached to the coolant source 415. As shown in FIG. 4, in the hybrid cooling system 400, the server units 402 that include advanced cooling plate modules 403 and high power chips 404 are submerged in a single phase liquid coolant in the immersion container 401. As shown in FIG. 4, the server units 402 are vertically mounted in the single phase liquid coolant. The cooling plates 403 is operated in the pumped two phase liquid coolant system. The hybrid cooling system 400 includes two phase liquid loops that are equipped with liquid supply pump 413 and liquid return pump 414. As shown in FIG. 4, the two phase loops are equipped with two pumps 413 and 414 and with three different channels managing the fluid, such as a liquid supply channel, a liquid return channel and a vapor return channel. As shown in FIG. 4, vapor channel 408 is located on the top of the system, liquid supply channel 406 is underneath the vapor channel 408 and above the liquid return channel 407 that is located at the bottom of the system. In at least some embodiments, the condenser 416 and coolant source 415 are used for connecting to more than one IT enclosures.

Figure 5:
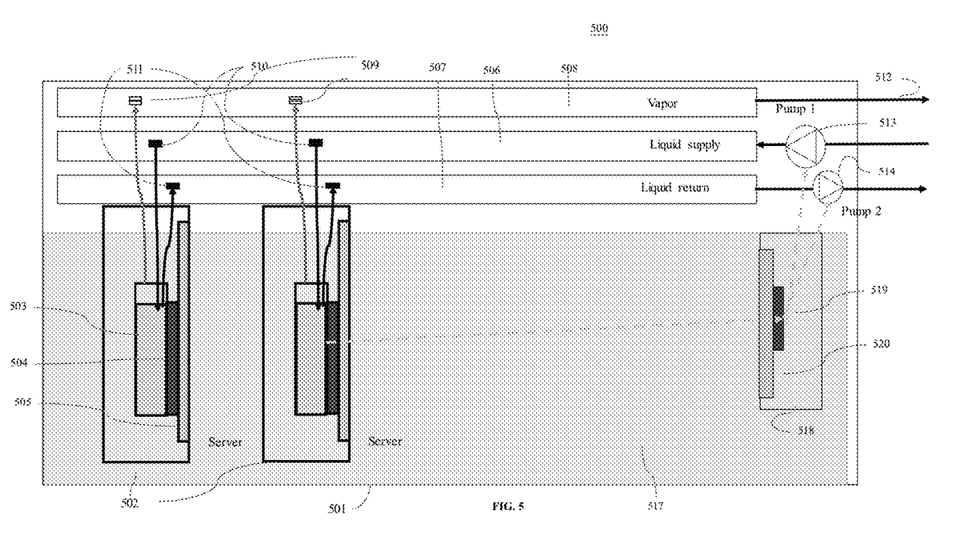
FIG. 5 is a view of a hybrid cooling system with a controller device according to one embodiment.

FIG. 5 is a view of a hybrid cooling system 500 with a controller according to one embodiment. The hybrid cooling system 500 includes an immersion container 501 that contains a single phase coolant 517 to accommodate server units 502 and a server unit 518. As shown in FIG. 5, a server unit 502 includes a high power chip 504 on a cooling plate module 503 on a chassis 505, as described above. In at least some embodiments, cooling plate module 503 represents one of the cooling plate modules (apparatuses), as described above. In at least some embodiments, the server unit 502 represents one of the server units 402. The hybrid cooling system 500 includes a liquid supply channel 506, a liquid return channel 507 and a vapor channel 508. The liquid supply channel 506 includes liquid supply ports 510 that are connected to the inlet ports of the server unit 502 to supply a two phase liquid coolant to the cooling plates 503 from a coolant source by using a liquid supply pump 513. The liquid return channel 507 includes liquid return ports 511 that are connected to the outlet ports of the server units 502 to return a heated liquid coolant from the cooling plates 603 back to the coolant source by using a liquid return pump 514. The vapor channel 508 includes vapor ports 509 that are connected to the vapor output ports of the server units 502 to output a vapor generated from the two phase coolant by a heat to a condenser via a vapor line 512. As shown in FIG. 5, the server unit 518 includes a controller device 519 (e.g., a processor, and/or other controller) on a printed circuit board 520. The controller 519 monitors one or more power conditions of each of the server units 502. The controller 519 monitors one or more power conditions of an overall immersion system that includes immersion container 501. In one embodiment, the controller collects the overall power input to the IT enclosure. In at least some embodiments, the one or more power conditions is an electric power. In at least some embodiments, the one or more power conditions is a temperature, a frequency, other power condition, or any combination thereof. As shown in FIG. 5, the controller 519 controls the operating speed of the pumps 513 and 514 on the liquid loops based on the monitored power conditions. The controller 519 collects the power conditions of the individual servers and the overall immersion system to adjust the speeds of the pumps. The controller 519 adjusts a speed of pump 513 that supplies the two phase coolant from the coolant source based on the one or more power conditions of the server units 502 and an overall immersion system. The controller 519 adjusts a speed of pump 514 that returns a heated liquid portion of the two phase coolant back to the coolant source based on the one or more power conditions of the server units 502 and an overall immersion system. In at least some embodiments, the pumps 513 and 514 are operated at different speeds. In at least some embodiments, the pumps 513 and 514 are operated at similar speeds. In one embodiment, the pumps 513 and 514 are integrated to the tank. In another embodiment, the pumps 513 and 514 are designed at the system. The integration of the pumps to the tank simplifies the overall control of the two pumps by the internal controller.

Figure 6:
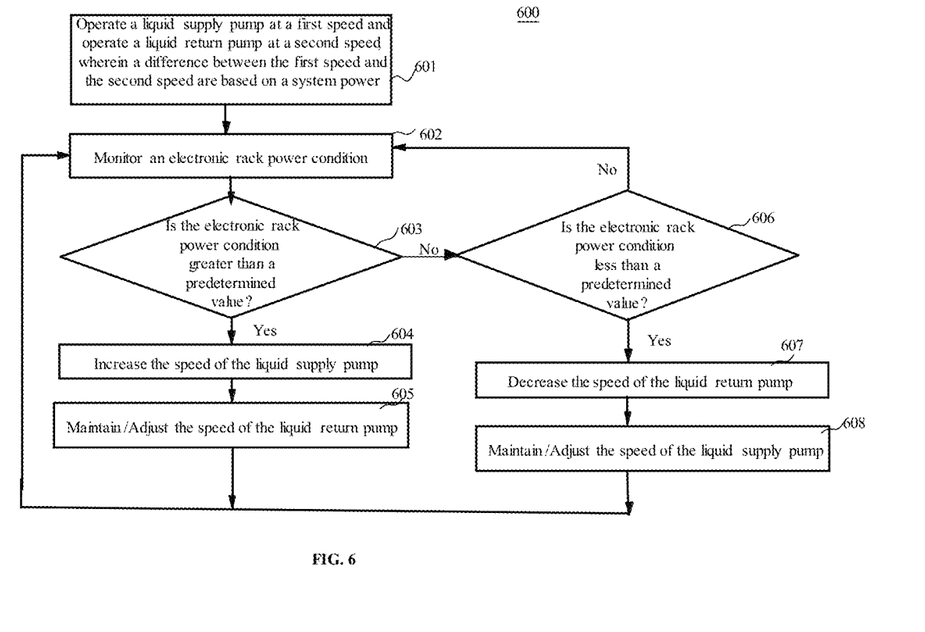
FIG. 6 is a flowchart of a method to cool an electronic rack of a data center according to one embodiment.

FIG. 6 is a flowchart of a method 600 to cool an electronic rack of a data center according to one embodiment. In at least some embodiments, the electronic rack includes one or more server units and one or more cooling plates, as described above. Method 600 begins at operation 601 that involves operating a first pump (e.g., liquid supply pump 513) to supply a coolant from a coolant source to one or more cooling plates at an initial liquid supply ("first") speed and operating a second pump (e.g., liquid return pump 514) to return a liquid portion of the coolant from the one or more cooling plates back to the coolant source at an initial liquid return ("second") speed. In at least some embodiments, the liquid supply speed is different from the liquid return speed. In at least some embodiments, the liquid supply speed is similar to the liquid return speed. In at least some embodiments, a difference between the liquid supply speed and the liquid return speed is determined based on a system power. At operation 602 an electronic rack power condition is monitored. In at least some embodiments, the electronic rack power condition includes one or more power conditions of individual server units, such as server units 502. In at least some embodiment, the electronic rack power condition includes one or more power conditions of overall immersion system, as described above with respect to FIG. 5. In at least some embodiments, the one or more power conditions is an electric power. In at least some embodiments, the one or more power conditions is a temperature, a frequency, other power condition, or any combination thereof. At operation 603 it is determined whether or not the electronic rack power condition is greater than a predetermined value. If the electronic rack power condition is greater than a predetermined value, the method 600 continues at operation 604 that includes increasing the speed of the supply pump. At operation 605 the speed of the liquid return pump is maintained or adjusted based on the speed of the liquid supply pump. In one embodiment, the speed of the liquid return pump is maintained or set back to the initial speed when the speed of the liquid supply pump is increased. The method 600 then returns to operation 602.

If the electronic rack power condition is not greater than a predetermined value, the method 600 continues at operation 606 that includes determining whether or not the electronic rack power condition is less than a predetermined value. If the electronic rack power condition is not less than a predetermined value, the method 600 returns to operation 602. If the electronic rack power condition is less than a predetermined value, at operation 607 the speed of the liquid return pump is decreased. At operation 608 the speed of the liquid supply pump is maintained or adjusted based on the speed of the liquid return pump. In one embodiment, the speed of the liquid supply pump is maintained or set back to the initial speed when the speed of the liquid return pump is decreased. The method 600 then returns to operation 602.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A cooling plate, comprising:
an inlet port to receive a coolant from a coolant source, wherein the coolant is a two-phase coolant that transforms from a liquid state into vapor when being attached to an electronic device to extract heat from the electronic device;
an outlet port to output at least a portion of the coolant back to the coolant source;
a bottom cooling channel connected to the inlet port at a bottom of the cooling plate,
a top cooling channel connected to the outlet port at a top of the cooling plate, wherein the bottom cooling channel and the top cooling channel extend on the cooling plate in a horizontal direction, wherein a plurality of internal cooling channels extend on the cooling plate between the bottom cooling channel and the top cooling channel in a vertical direction, wherein the plurality of internal cooling channels input a liquid portion and a vapor portion of the two-phase coolant to the top cooling channel, wherein the outlet port is coupled to an end of the top cooling channel to directly output the liquid portion of the two-phase coolant in the horizontal direction through a side of the cooling plate, wherein the top cooling channel is connected with a vapor exit channel separated from the outlet port, wherein the outlet port is connected to the internal cooling channels through the top cooling channel;
wherein the vapor portion of the two-phase coolant directly exits the top cooling channel via the vapor exit channel and a first vapor port disposed on the top of the cooling plate; and
wherein the first vapor port outputs the vapor generated from the coolant to a condenser that is configured to condense the vapor back to the liquid state.

2. The cooling plate of claim 1, further comprising:
a vapor channel connected to the first vapor port.

3. The cooling plate of claim 1, further comprising:
the plurality of internal cooling channels coupled to the first vapor port; and
one or more fins separating the plurality of internal cooling channels.

4. The cooling plate of claim 1, wherein the first vapor port is disposed at a top side of the cooling plate.

5. The cooling plate of claim 1, wherein the outlet port and the inlet port are disposed at opposing sides of the cooling plate.

6. The cooling plate of claim 1, wherein the outlet port and the inlet port are located at different heights along the side of the cooling plate, or wherein the outlet port and the inlet port are at similar heights along the side of the cooling plate.

7. The cooling plate of claim 1, wherein the first vapor port connects to one or more fluid channels.

8. The cooling plate of claim 1, further comprising one or more second vapor ports to output the vapor generated from the coolant.

* * * * *